United States Patent
Tung et al.

(10) Patent No.: US 7,948,772 B2
(45) Date of Patent: May 24, 2011

(54) MEMORY CARD WITH ELECTROSTATIC DISCHARGE PROTECTION AND MANUFACTURING METHOD THEREOF

(75) Inventors: Yueh-Ming Tung, Kaohsiung County (TW); Kuo-Yang Sun, Kaohsiung (TW); Chia-Ming Yang, Tainan (TW); Chung-Lun Lee, Kaohsiung (TW); Jin-Chun Wen, Pingtung County (TW); Yuan-Wei Liu, Kaohsiung (TW); Wei-Mao Hung, Kaohsiung (TW)

(73) Assignee: Orient Semiconductor Electronics, Kaohsiung (TW)

( * ) Notice: Subject to any disclaimer, the term of this patent is extended or adjusted under 35 U.S.C. 154(b) by 139 days.

(21) Appl. No.: 12/371,794

(22) Filed: Feb. 16, 2009

(65) Prior Publication Data

US 2009/0154040 A1 Jun. 18, 2009

Related U.S. Application Data

(63) Continuation-in-part of application No. 11/531,000, filed on Sep. 12, 2006, now abandoned.

(30) Foreign Application Priority Data

Jul. 4, 2006 (TW) ................................ 95124284 A

(51) Int. Cl.
*H05K 9/00* (2006.01)

(52) U.S. Cl. .................... 361/818; 361/777; 361/767
(58) Field of Classification Search .................. 361/760, 361/748, 729, 736, 777, 778, 111, 767, 816, 361/818, 799, 796, 790, 737; 174/520, 541
See application file for complete search history.

(56) References Cited

U.S. PATENT DOCUMENTS

| | | | |
|---|---|---|---|
| 5,319,523 A | 6/1994 | Ganthier et al. | |
| 6,804,119 B2 | 10/2004 | Ziemkowski | |
| 6,842,585 B2 * | 1/2005 | Matsuo et al. | 396/89 |
| 2008/0007932 A1 * | 1/2008 | Tung et al. | 361/816 |

FOREIGN PATENT DOCUMENTS

| | | |
|---|---|---|
| JP | 02-260686 | 10/1990 |
| JP | 2001-209773 | 8/2001 |
| JP | 2006-106822 | 4/2006 |

OTHER PUBLICATIONS

Japanese Examination Report of Japan Patent Application No. 2006-289595, dated Nov. 10, 2009.

* cited by examiner

*Primary Examiner* — Hung S Bui
(74) *Attorney, Agent, or Firm* — J.C. Patents

(57) ABSTRACT

A memory card with electrostatic discharge (ESD) protection and a manufacturing method thereof are provided. The memory card includes a circuit board, a set of contacts, at least one chip and an ESD protection path. The signal paths of the board is not exposed at the edge of the circuit board. The ESD protection path for transmitting ESD current is disposed on the circuit board. Furthermore, a part of the ESD protection path extends to the edge of the circuit board.

19 Claims, 6 Drawing Sheets

US 7,948,772 B2

MEMORY CARD WITH ELECTROSTATIC DISCHARGE PROTECTION AND MANUFACTURING METHOD THEREOF

CROSS-REFERENCE TO RELATED APPLICATION

This is a continuation-in-part application of patent application Ser. No. 11/531,000, filed on Sep. 12, 2006, which claims the priority benefit of Taiwan patent application serial no. 95124284, filed on Jul. 4, 2006. The entirety of each of the above-mentioned patent applications is hereby incorporated by reference herein and made a part of this specification.

BACKGROUND OF THE INVENTION

1. Field of the Invention

The present invention relates to a memory card, and more particularly, to a memory card with electrostatic discharge protection.

2. Description of Related Art

An electronic product operating in an actual working environment often encounters the destructive impact of electrostatic discharge (ESD). If a suitable form of protection is not set up, devices within the electronic product may cause permanent damages. In general, the ESD voltage is substantially greater than the power source voltage for operating the electronic product. When an ESD occurs, the ESD current is likely to burn up the internal devices. Therefore, isolating the ESD current to prevent possible damage to the devices is very important.

To prevent the aforementioned ESD phenomenon, some ESD protection facilities are set up inside the electronic products. For example, grounding fingers of U.S. Pat. No. 5,319,523 can be electrically connected first to back plane circuit board than signal fingers by position arranging of grounding fingers and signal fingers on card edge connector portion of printed circuit board when the card edge connector portion of the printed circuit board is inserted into the a connector. The U.S. Pat. No. 5,319,523 does not teach that conductive surface traces 66, which electrically connect the grounding pad and grounding finger, (ESD protection path) extend to the edge of the circuit board, and therefore electrostatic charges cannot be collected by the ESD protection path and rapidly transmitted out of circuit board through the ground pad and fingers. Furthermore, the U.S. Pat. No. 5,319,523 does not teach the technique that can prevent electrostatic charges entering the conductive surface traces 56 (signal path) from damaging the components on the printed circuit board. Similarly, U.S. Pat. No. 6,804,119 does not teach the techniques that ESD protection path extend to the edge of the circuit board and prevent electrostatic charges from entering signal path.

The convention memory card utilizes its casing to protect the internal devices and provides a certain degree of ESD shielding capacity. However, as the memory card evolves toward smaller dimension according to the current trend, the casing alone can hardly provide sufficient ESD protective capacity.

FIG. 1A is a diagram showing the layout of the printed circuit board of a conventional memory card. As shown in FIG. 1A, a patterned circuit layout is disposed on the printed circuit board 100. Because the process of fabricating the printed circuit board 100 requires a plating treatment, each electrical path in the printed circuit board 100 is extended into areas outside the cutting lines 110 to facilitate the plating operation. The extended electrical paths disposed to facilitate the plating operation are called plating lines. After completing the processes (for example, the plating operation) for forming the printed circuit board 100, the board is cut out along the cutting lines 110. FIG. 1B is a diagram showing the printed circuit board 100 of a conventional memory card after completing the board cutting process.

As shown in FIG. 1B, after the board cutting process, subsequent production processes including disposing and soldering memory devices (such as flash memory integrated circuits) and other devices, assembling the casing and so on are performed on the printed circuit board 100 to produce a complete memory card. Because the plating lines for facilitating the plating operation cross over the cutting lines 110, the plating lines at the edge of the printed circuit board 100 will be exposed after the cutting operation. Since each of these plating lines is electrically connected to the corresponding electrical path in the printed circuit board 100, static electric charges will flow into the electrical paths through the plating lines at the cut edges of the printed circuit board 100 when an ESD occurs. Ultimately, the devices (not shown) on the printed circuit board 100 may be damaged.

SUMMARY OF THE INVENTION

Accordingly, at least one objective of the present invention is to provide a memory card with electrostatic discharge (ESD) protection such that the ESD protective capacity is sufficient for preventing possible damage to the electrical devices inside the memory card in an ESD.

To achieve these and other advantages and in accordance with the purpose of the invention, as embodied and broadly described herein, the invention provides a memory card with electrostatic discharge (ESD) protection. The memory card includes a circuit board, a set of contacts, at least one chip and an ESD protection path. The memory device disposed on the circuit board is electrically connected to the set of contacts through the signal paths. Wherein, each of the signal paths is not exposed at the edge of the circuit board that prevents electrostatic charges entering from damaging the chips on the circuit board. The ESD protection path for transmitting ESD current is disposed on the circuit board. Furthermore, a part of the ESD protection path extends to the edge of the circuit board that electrostatic charges can rapidly be collected and transmitted out of circuit board through grounding.

According to the memory card with ESD protection in one preferred embodiment of the present invention, the ESD protection path includes a metal layer having no contact with the signal paths. The metal layer is a copper film occupying a large area, for example.

According to the memory card with ESD protection in one preferred embodiment of the present invention, the ESD protection path includes a ring-shaped area. Furthermore, the ring-shaped area is formed near the periphery of the circuit board.

The invention provides a method of manufacturing memory card with ESD protection. The method comprises defining a cutting lines of a circuit board. A patterned circuit including a set of contacts, an ESD protection path and a signal paths are disposed on the circuit board. Wherein, a plating lines of the ESD protection path and a plating lines of the signal paths extend to the area outside the cutting lines of the circuit board to facilitate a plating operation. After completing the plating operation, the plating lines of the signal paths are removed. After that, the circuit board along the cutting line is cut off for forming an edge of the circuit board, wherein each of the signal paths is not exposed at the edge of the circuit board, and the plating lines of the ESD protection paths are exposed at the edge of the circuit board. At least one chip is disposed on the circuit board, wherein the chip electrically connects to the set of contacts through the signal paths.

In the present invention, an ESD protection path is disposed on the memory card and a part of the ESD protection path is extended to the edge of the circuit board, so that ESD current is transmitted to the ESD protection path and damaging the internal devices is prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
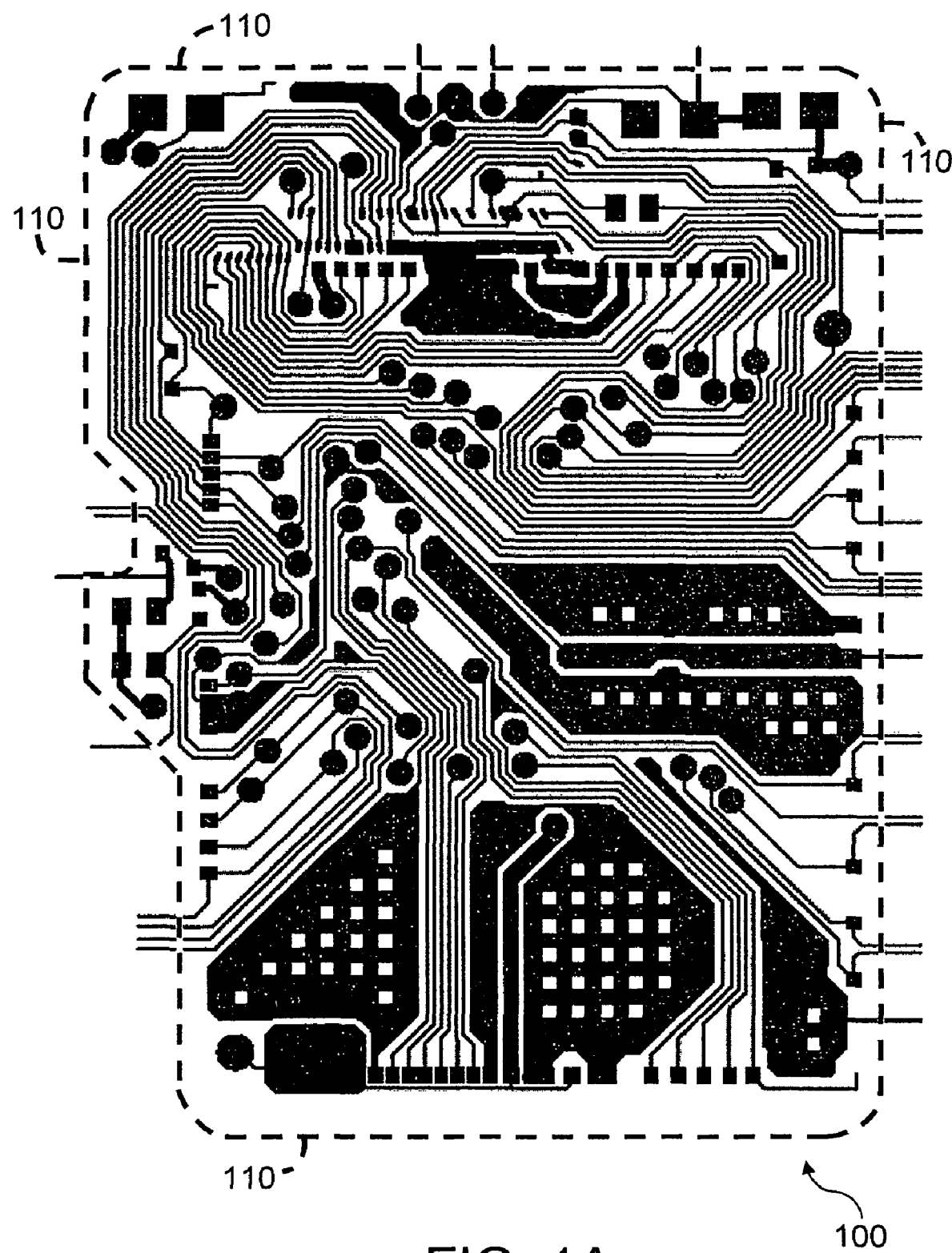
FIG. 1A is a diagram showing the layout of the printed circuit board of a conventional memory card.
Figure 1B:
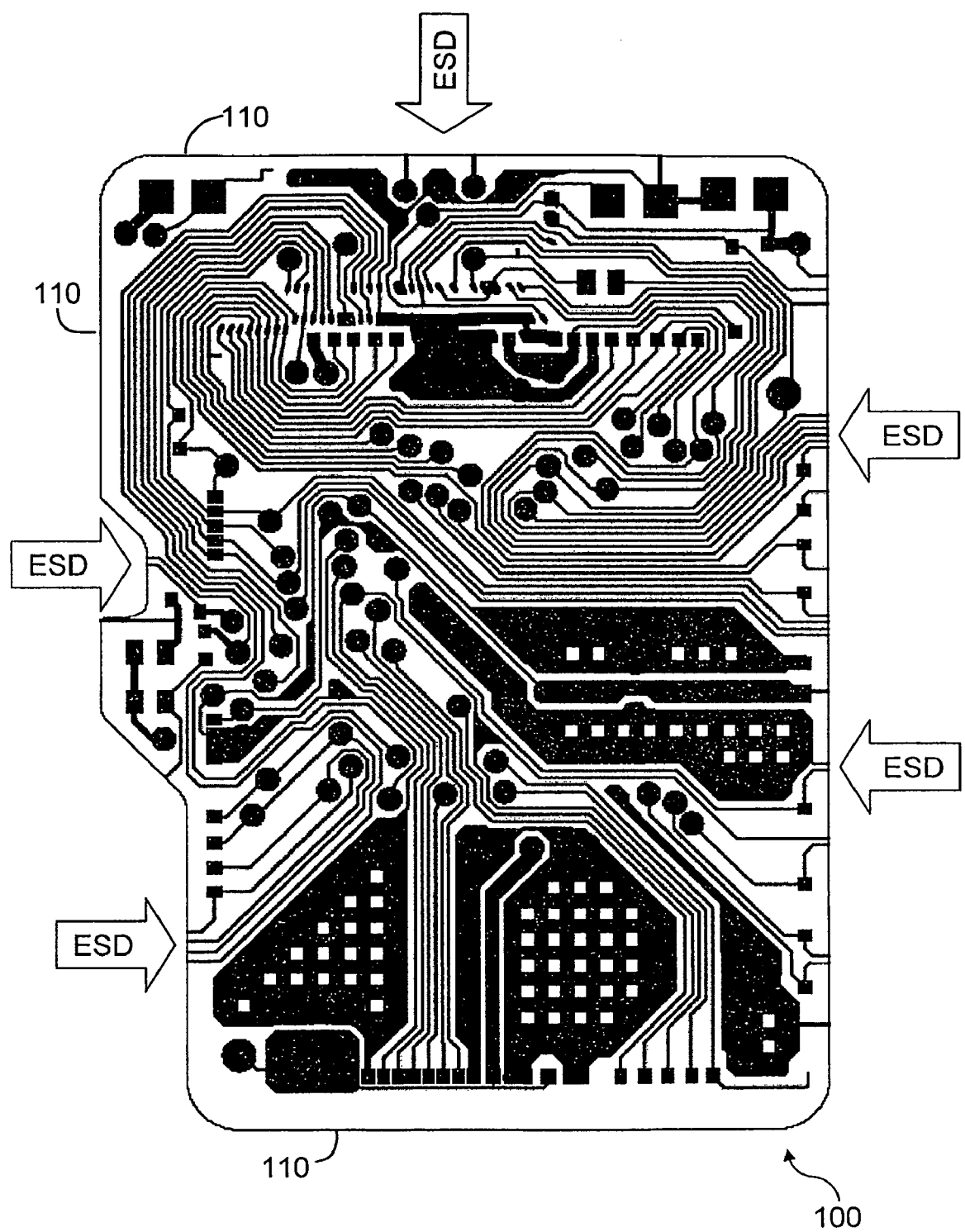
FIG. 1B is a diagram showing the printed circuit board 100 of a conventional memory card after the board cutting process is completed.

Reference will now be made in detail to the present preferred embodiments of the invention, examples of which are illustrated in the accompanying drawings. Wherever possible, the same reference numbers are used in the drawings and the description to refer to the same or like parts.

To facilitate a comparison with the aforementioned conventional technique, the diagram in FIG. 1A is used as an example of the embodiment in the present invention in the following description. In other words, the processes of fabricating the printed circuit board in the following embodiments include disposing plating lines. However, anyone familiar with the technique may apply the present invention to fabricate other types of printed circuit boards according to the spirit and instruction described in the following embodiments. In other words, whether to dispose the plating lines or not depends on the particular printed circuit board processing technique. Hence, the scope of the present invention should by no means be limited by the following embodiments.

Figure 2A:
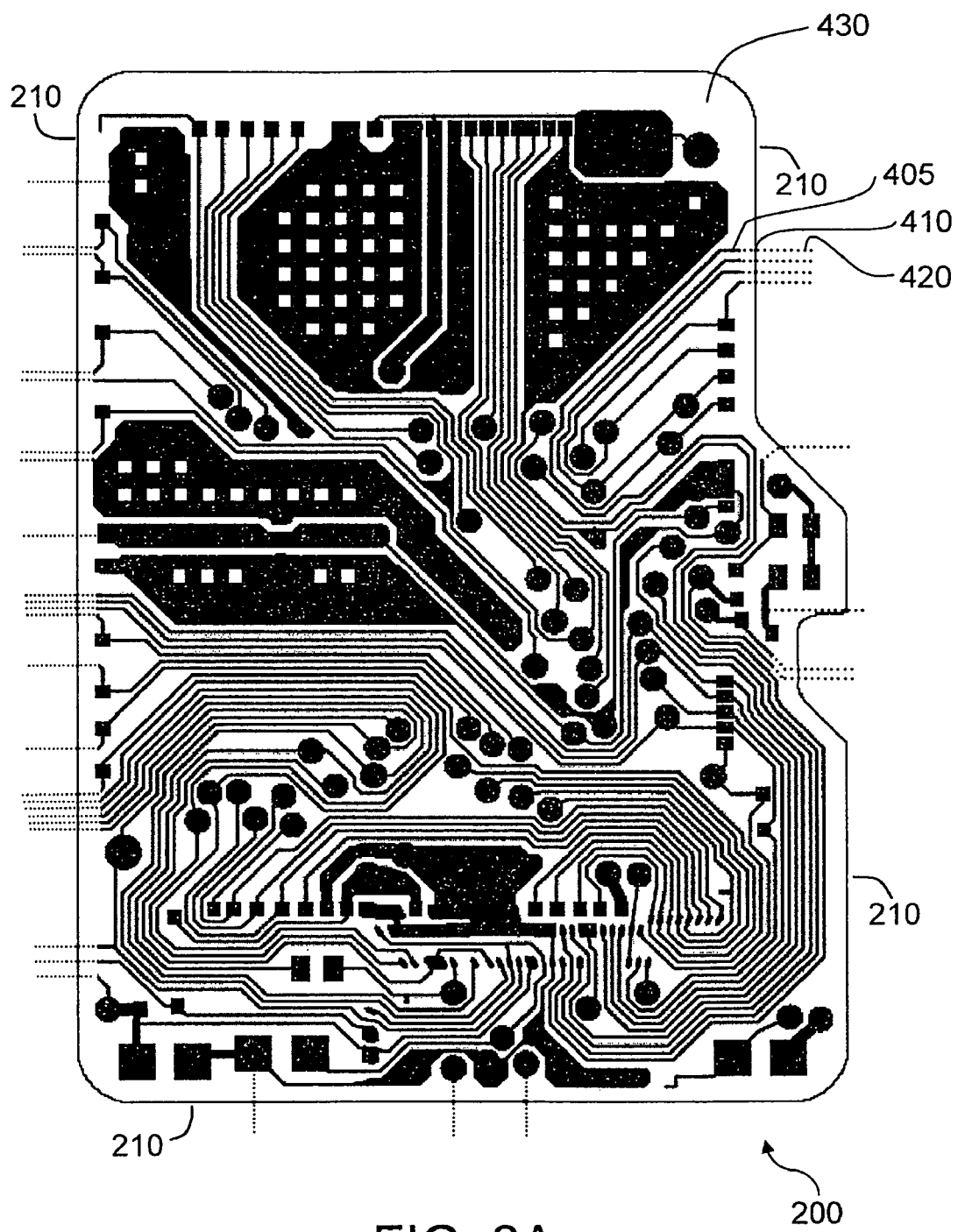
FIG. 2A is a diagram showing the wiring layout of the top layer of a memory card printed circuit board according to one embodiment of the present invention.
Figure 2B:
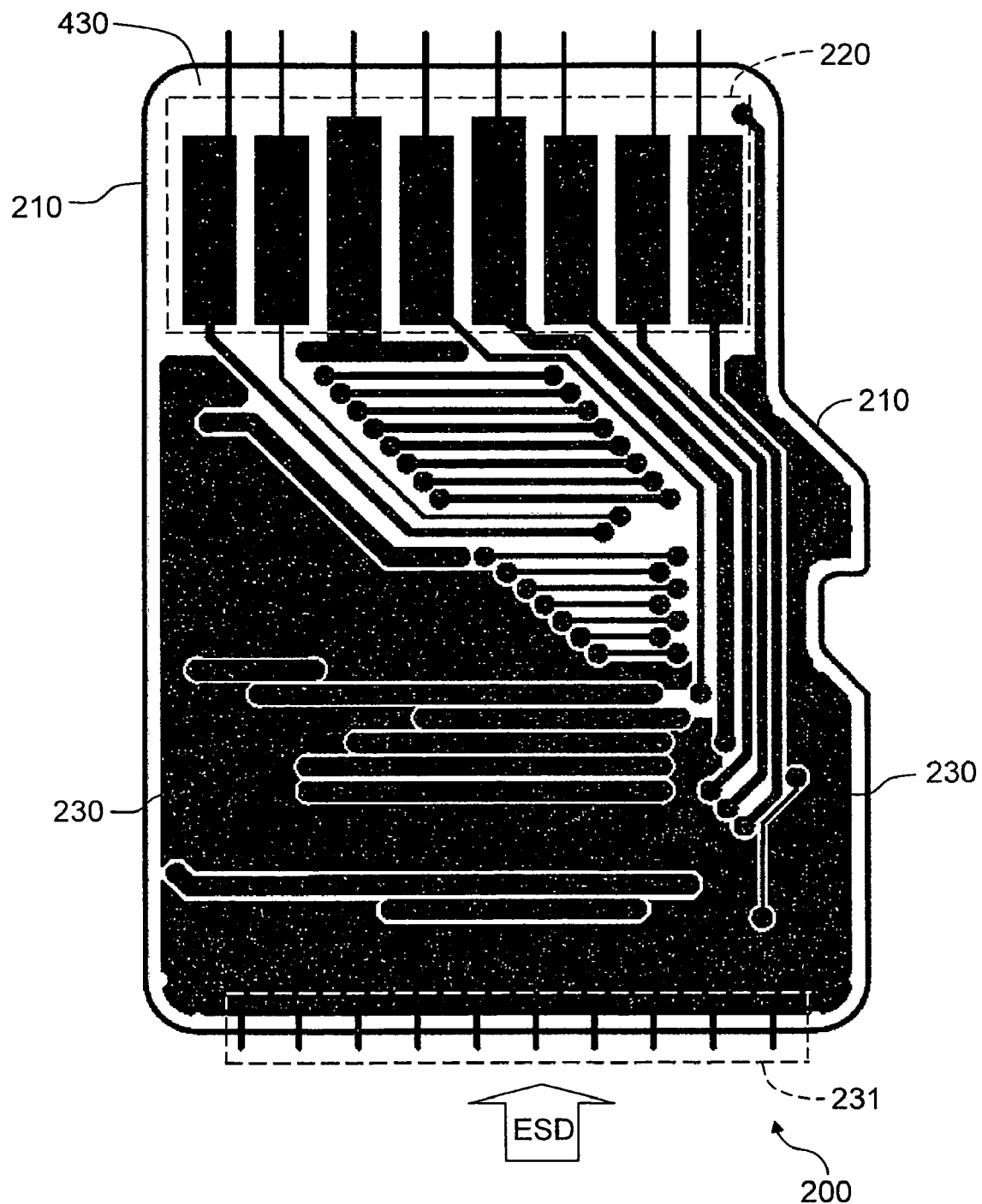
FIG. 2B is a diagram showing the wiring layout of the bottom layer of a memory card printed circuit board according to one embodiment of the present invention.

As shown in FIGS. 2A and 2B, the memory card 200 includes a circuit board 430, a set of contacts 220, and a plurality of chips (not shown) including memory chip and control chip, wherein the set of contacts 220 and the chips are disposed on the circuit board 430. The circuit board 430 in the present embodiment is a printed circuit board. The printed circuit board 430 has a top layer and a bottom layer each having a patterned circuit disposed thereon. The set of contacts 220 is disposed on the bottom layer for electrical connection to external device (not shown) such as card reader, digital camera . . . etc. The set of contacts 220 includes at least one power terminal, at least one ground terminal and at least one data terminal. The chips (not shown) are disposed on the top layer of the circuit board 430, and the chips are electrically connected to the data terminal of the set of contacts 220 through the signal paths in the top layer of the circuit board 430. The bottom layer has an ESD protection path 230. The ESD protection path 230 is electrically connected to the ground terminal of the set of contacts 220. Furthermore, the ESD protection path 230 is a ground-connecting circuit on the bottom layer that is not contact to the signal paths on the circuit board 430. The ground-connecting circuit includes the ground pads for connecting with the chips on the circuit board 430 and the large area copper film for connecting with the ground pads. In the present embodiment, the foregoing ground-connecting circuits are implemented using metal layers, for example, copper, copper compound or other conductive material.

The most important aspect of the present invention is that a part of the foregoing ESD protection path 230 (for example, the protrusions 231 shown in FIG. 2B) on the bottom layer of the circuit board 430 is exposed at the edge of the circuit board 430 so that external ESD current can be collected and transmitted through the ESD protection circuit. However, each of the signal paths 405 on the top layer of the circuit board 430 is not exposed at the edge of the circuit board 430, so as to prevent electrostatic charges entering from damaging the electronic devices on the memory card 200.

For one of skill in the art, a part of the edge (the edge near the border of the circuit board 430) of the ESD protection path 230 may extend to the edge of the circuit board 430 so that the edge of the printed circuit board can expose more of the ESD protection path 230.

In the present embodiment, the memory chip (not shown) can be a non-volatile memory such as flash memory.

The patterned circuit on the printed circuit board 430 in the memory card structure is also formed using the conventional plating treatment process. Hence, each of the electrical paths (e.g. the electrical path 405) in the printed circuit board 430 is extended to the area outside the cutting lines 210 (i.e., the edge of the circuit board 430) to facilitate the plating operation. The foregoing extended parts of the electrical paths for performing the plating operation are called the plating lines (e.g. the plating line 420). In the present embodiment, after completing the plating operation, the plating lines 420 (the dash lines in FIG. 2A) connected to the signal paths 405 on the top side of the circuit board 430 are removed by etching or some other method to form concave paths 410, which is electrical insulation, between the signal paths 405 and the edge of the circuit board 430 (i.e., the cutting line 210).

Figure 4:
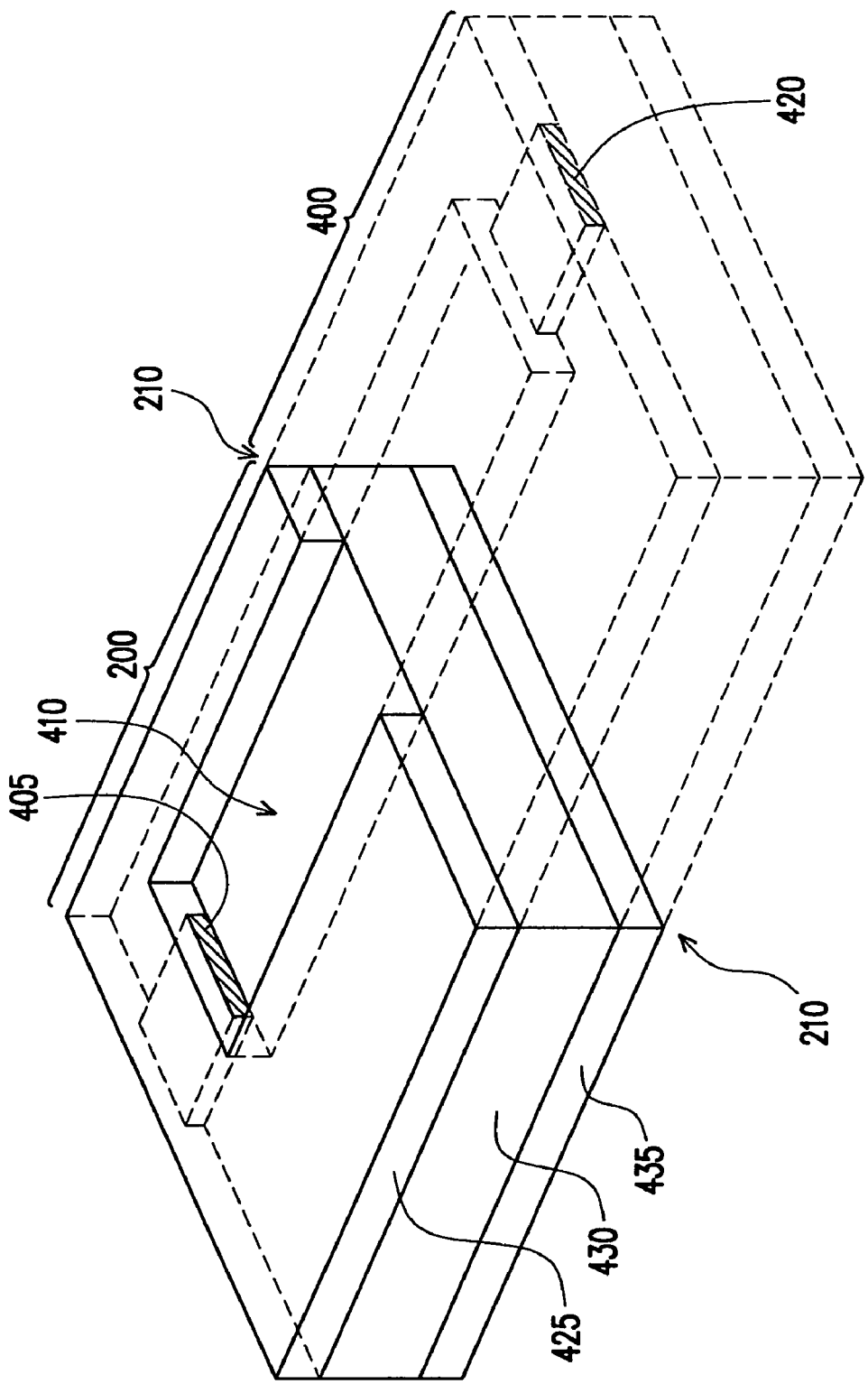
FIG. 4 is a 3D diagram of concave paths 410 in FIG. 2A according to one embodiment of the present invention.

FIG. 4 is a 3D diagram of concave paths 410 in FIG. 2A according to one embodiment of the present invention. The solder mask 425 and 435 are printed on the surface of the circuit board 430. After completing the etching or some other operation, the plating lines 420 connected to the signal paths 405 on the circuit board 430 are removed to form concave paths 410. The circuit board 430 along the cutting line 210 is cut off for removing the redundant board 400. Therefore, after the circuit board 430 along the cutting line 210 is cut off, only the protrusions 231 on the ESD protection paths 230 of the printed circuit board 430 are exposed (as show in FIGS. 2 A and 2B).

In FIG. 2B, when an electrostatic discharge (ESD) occurs, electrostatic charges will enter the ESD protection path 230 via the exposed protrusions 231 on the edge of the printed circuit board 430. Then, the electrostatic charges are rapidly dispersed in the memory card through the ESD protection path 230 and then transmitted out of the memory card 200 through the ground terminal in the set of contacts 220. Therefore, the present embodiment can prevent an ESD from damaging the devices (not shown) on the memory card 200.

The ESD protection path 230 of present embodiment can easily collect the ESD charge by the part of the ESD protection path extended to the edge of the circuit board. The prior art does not have above technique features of the present embodiment. For example, in the U.S. Pat. No. 5,319,523, the conductive surface traces 66, which electrically connect grounding finger 64, and grounding pad 60 are disposed near edge of the printed circuit board. The grounding pad 60 or the traces 66 (ground-connecting circuit) is not exposed at the edge of the printed circuit board in the U.S. Pat. No. 5,319,523. In other words, the prior art does not teach that ESD protection path extend to (exposed at) the edge of the circuit board. The situation of U.S. Pat. No. 6,804,119 is similar in U.S. Pat. No. 5,319,523 too. Therefore, the probability of damage of component is raised when an ESD occurs at the edge of the circuit board.

On the other hand, the signal paths 405 of present embodiment can reduce the probability of ESD damage because the plating line 420 is etched back with the result that the signal paths is not exposed at the edge of the circuit board. The prior art does not have above technique features of the present embodiment, so that electrostatic charges will easily enter the circuit board to damage the internal devices when an ESD occurs.

Figure 3:
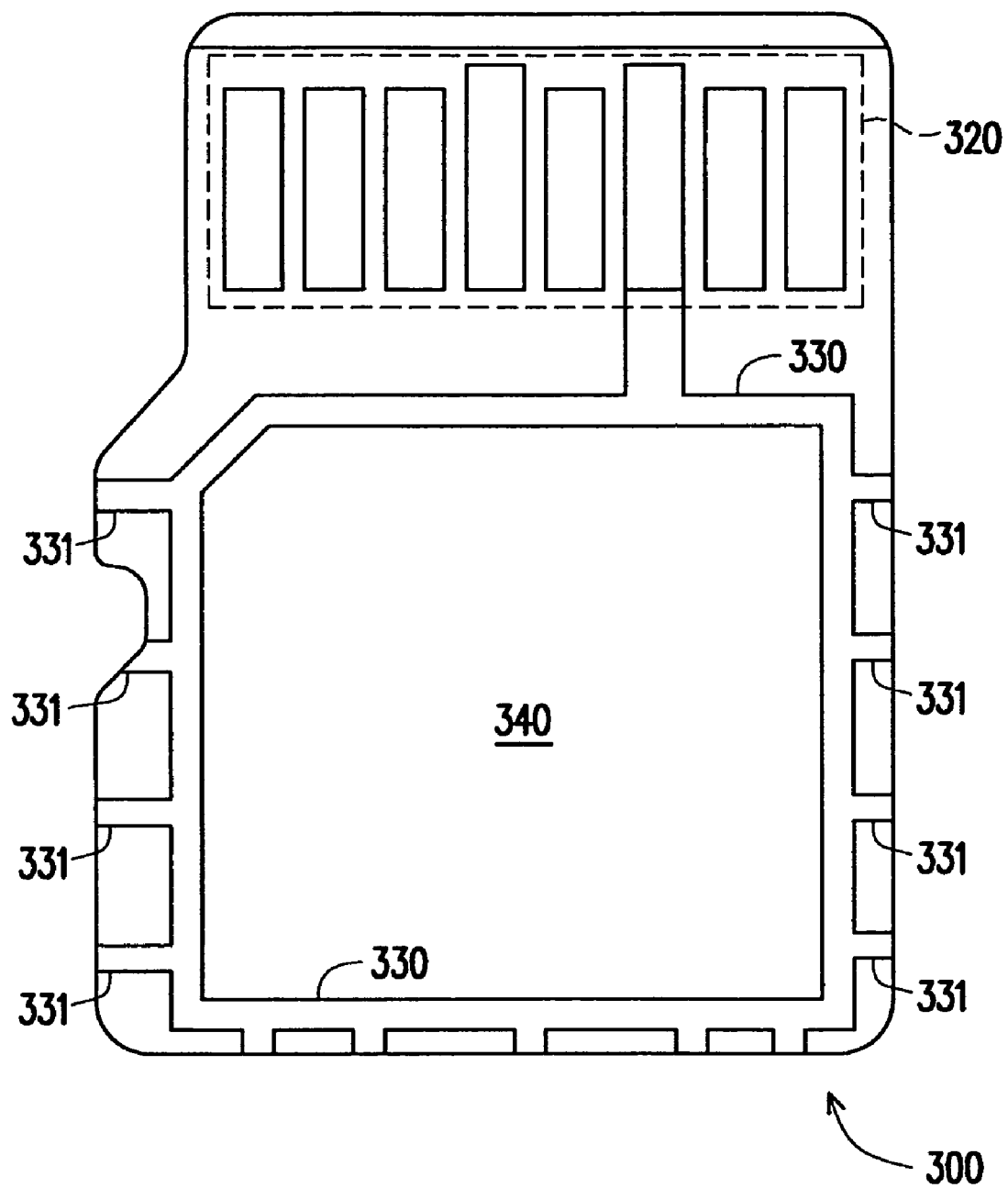
FIG. 3 is a diagram of another ESD protection path according to one embodiment of the present invention.

In addition, the method of implementing the ESD protection path in the present invention is not limited to the one mentioned above. For example, FIG. 3 is a diagram of another ESD protection path according to one embodiment of the present invention. In FIG. 3, another circuit layout of the bottom layer of the memory card printed circuit board is shown, but the description of the signal paths is omitted. The top layer of the circuit board in the present embodiment is identical to the one in FIG. 2 of the previous embodiment. Each of the signal paths on the top layer of the circuit board is not exposed to the edge of the circuit board to prevent ESD from damaging the electronic devices on the memory card 300.

Furthermore, the chips (not shown) disposed on the top layer are electrically connected to the set of contacts 320 on the bottom layer through the signal paths (not shown). The set of contacts 320 includes, for example, a power terminal, a ground terminal and a data terminal. The ESD protection path 330 disposed on the bottom layer of the circuit board is used for transmitting ESD current. The ESD protection path 330 is electrically connected to the ground terminal of the set of contacts 320. In the present embodiment, a ring-shaped area that does not have any contact with the signal paths in the memory card 300 is used to implement the ESD protection path 330. The ring-shaped area is formed near the periphery of the circuit board. The ESD protection path 330 is fabricated using copper, copper compound or other conductive material.

In the present embodiment, a part of the ESD protection path 330 (for example, the plurality of protrusions 331 in FIG. 3) extends past the cutting line of the printed circuit board. Therefore, after the circuit board along the cutting line is cut off, the edge of the printed circuit board in the memory card 300 will expose the protrusions 331 on the ESD protection path 330. As anyone familiar with the technique may notice, the part of the ESD protection path 330 in the periphery (the area near the border of the circuit board) may extend to the edge of the circuit board so that the edge of the printed circuit board can expose more of the ESD protection path 330.

Because the plating lines on the top layer of the printed circuit board in the memory card 300 have been removed by etching or other method, electrostatic charges are able to enter the ESD protection path 330 through the exposed protrusions 331 at the edge of the printed circuit board when an ESD occurs. Then, the electrostatic charges are rapidly transmitted out of the memory card 300 through the ESD protection path 330 and the ground terminal in the set of contacts 320. Therefore, the present embodiment can prevent the ESD from damaging the devices (not shown) on the memory card 300.

In summary, an ESD protection path is disposed on the memory card in the present invention and a part of the ESD protection path is extended to the edge of the board. Therefore, ESD current is transmitted to the ESD protection path and damaging the internal devices is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory card with electrostatic discharge (ESD) protection, comprising:
   a circuit board, wherein each of signal paths of the circuit board is not exposed at the edge of the circuit board, and the circuit board is surround by a cutting line and has a concave path between the signal paths and the cutting line;
   a set of contacts disposed on the circuit board for electrical connection to external device;
   at least one chip disposed on the circuit board and electrically connected to the set of contacts through the signal paths; and
   an ESD protection path disposed on the circuit board for transmitting an ESD current, wherein a part of the ESD protection path extends to the area outside the cutting line of the circuit board.

2. The memory card with ESD protection of claim 1, wherein the ESD protection path comprises a ground-connecting circuit on the circuit board that has no electrical contact with the signal paths.

3. The memory card with ESD protection of claim 1, wherein the set of contacts comprises at least one power terminal, at least one ground terminal and at least one data terminal, and the ESD protection path is electrically connected to the ground terminal.

4. The memory card with ESD protection of claim 1, wherein the ESD protection path comprises a metal layer.

5. The memory card with ESD protection of claim 1, wherein the ESD protection path has at least one protrusion that extends to the edge of the circuit board.

6. The memory card with ESD protection of claim 1, wherein the ESD protection path comprises a ring-shaped area that is formed near the periphery of the circuit board.

7. The memory card with ESD protection of claim 6, wherein the ring-shaped area is not electrical contact to the signal paths.

8. The memory card with ESD protection of claim 6, wherein the periphery of the ring-shaped area has at least one protrusion that extends to the edge of the circuit board.

9. The memory card with ESD protection of claim 1, wherein the concave path being electrical insulation.

10. A method of manufacturing memory card with ESD protection, comprising:
    defining a cutting line of a circuit board;

disposing a patterned circuit including a set of contacts, an ESD protection path and signal paths on a circuit board, wherein a plating lines of the ESD protection path and a plating lines of the signal paths extend to the area outside the cutting line of the circuit board;

removing the plating lines of the signal paths;

cutting off the circuit board along the cutting line for forming a edge of the circuit board, wherein each of the signal paths is not exposed at the edge of the circuit board, and the plating lines of the ESD protection paths are exposed at the edge of the circuit board; and disposing at least one chip on a circuit board, wherein the chip electrically connects to the set of contacts through the signal paths.

11. The method of manufacturing memory card with ESD protection of claim 10, wherein the plating lines of the signal paths are removed by etching.

12. The method of manufacturing memory card with ESD protection of claim 10, wherein the circuit board is a printed circuit board.

13. The method of manufacturing memory card with ESD protection of claim 10, wherein the ESD protection path comprises a ground-connecting circuit on the circuit board that has no electrical contact with the signal paths.

14. The method of manufacturing memory card with ESD protection of claim 13, wherein the set of contacts comprises at least one power terminal, at least one ground terminal and at least one data terminal, and the ESD protection path is electrically connected to the ground terminal.

15. The method of manufacturing memory card with ESD protection of claim 10, wherein the ESD protection path comprises a metal layer.

16. The method of manufacturing memory card with ESD protection of claim 10, wherein the ESD protection path has at least one protrusion that extends to the edge of the circuit board.

17. The method of manufacturing memory card with ESD protection of claim 10, wherein the ESD protection path comprises a ring-shaped area that is formed near the periphery of the circuit board.

18. The method of manufacturing memory card with ESD protection of claim 17, wherein the ring-shaped area is not electrical contact to the signal paths.

19. The method of manufacturing memory card with ESD protection of claim 17, wherein the periphery of the ring-shaped area has at least one protrusion that extends to the edge of the circuit board.

* * * * *